(12) United States Patent
Zhou

(10) Patent No.: US 12,052,897 B2
(45) Date of Patent: Jul. 30, 2024

(54) DISPLAY PANEL AND DISPLAY DEVICE

(71) Applicant: Wuhan China Star Optoelectronics Semiconductor Display Technology Co., Ltd., Hubei (CN)

(72) Inventor: Sisi Zhou, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 1025 days.

(21) Appl. No.: 16/966,150

(22) PCT Filed: Mar. 17, 2020

(86) PCT No.: PCT/CN2020/079672
§ 371 (c)(1),
(2) Date: Jul. 30, 2020

(87) PCT Pub. No.: WO2021/128607
PCT Pub. Date: Jul. 1, 2021

(65) Prior Publication Data
US 2023/0165068 A1    May 25, 2023

(30) Foreign Application Priority Data
Dec. 27, 2019    (CN) .......................... 201911372962.9

(51) Int. Cl.
*H10K 59/124*        (2023.01)
*H10K 59/80*         (2023.01)

(52) U.S. Cl.
CPC ......... *H10K 59/124* (2023.02); *H10K 59/873* (2023.02)

(58) Field of Classification Search
CPC ....... H10K 50/00–88; H10K 59/00–95; H10K 71/00–861; H10K 2102/00–361; H01L 21/76802–76817; H01L 23/481
See application file for complete search history.

(56) References Cited

U.S. PATENT DOCUMENTS

| | | | |
|---|---|---|---|
| 2018/0053816 A1 | 2/2018 | Choi et al. | |
| 2020/0365667 A1* | 11/2020 | Jo | ............ H10K 59/00 |
| 2020/0381495 A1* | 12/2020 | Jeon | ........................ H10K 59/38 |
| 2021/0202626 A1* | 7/2021 | Jeon | ...................... H10K 50/822 |

FOREIGN PATENT DOCUMENTS

| | | |
|---|---|---|
| CN | 109427861 | 3/2019 |
| CN | 109616506 | 4/2019 |
| CN | 109659444 | 4/2019 |
| CN | 110010665 | 7/2019 |
| CN | 110021642 | 7/2019 |
| CN | 110137370 | 8/2019 |
| JP | 2019-029303 | 2/2019 |

* cited by examiner

*Primary Examiner* — Shahed Ahmed

(57) ABSTRACT

The present application provides a display panel and a display device. The display panel includes a display region, a peripheral region, and a light transmissive region. The peripheral region surrounds the light transmissive region, and the display region surrounds the peripheral region. The display panel includes an inorganic insulating layer, an organic insulating layer, and a thin film encapsulation layer stacked on each other. By forming a groove in the inorganic insulating layer in the peripheral region, the thin film encapsulation layer is in contact with the inorganic insulating layer through the groove, so that cracks are stopped from extending inwardly during cutting in the light transmissive region.

13 Claims, 6 Drawing Sheets

DISPLAY PANEL AND DISPLAY DEVICE

RELATED APPLICATIONS

This application is a National Phase of PCT Patent Application No. PCT/CN2020/079672 having International filing date of Mar. 17, 2020, which claims the benefit of priority of Chinese Patent Application No. 201911372962.9, filed on Dec. 27, 2019. The contents of the above applications are all incorporated by reference as if fully set forth herein in their entirety.

FIELD AND BACKGROUND OF THE INVENTION

The present application relates to a field of display technology and in particular, to a display panel and a display device.

DESCRIPTION OF RELATED ART

In order to meet a growing demand for higher screen ratios, organic light-emitting diode (OLED) display panels with an under-screen camera have become one of the mainstream designs in the field of OLED display panels. Normally, a display panel with an under-screen camera is provided with a light transmissive region in a display region, and a through hole is formed by cutting off a corresponding portion in the light transmissive region to expose a camera assembly at the back of the OLED display panel, thereby forming the under-screen camera. When cutting out the through hole, a thin film encapsulation layer includes a CVD inorganic layer, and internal or external forces during cutting easily cause cracks at cutting edges, and the generated cracks can extend to the inside of the OLED display panel.

Therefore, a technical problem that needs to be solved at present is how to prevent the cracks, generated during the cutting of the through hole of the under-screen camera OLED display panel, from extending inwardly.

SUMMARY OF THE INVENTION

The present application provides a display panel and a display device, which can solve a technical problem that cracks are generated and extended inwardly when an under-screen camera OLED display panel is cut to form a through hole.

Accordingly, the present application provides a technical solution as follows. The present application provides a display panel, comprising:
  a display region, a light transmissive region, and a peripheral region, wherein the peripheral region surrounds the light transmissive region, and the display region surrounds the peripheral region;
  an inorganic insulating layer, an organic insulating layer, and a thin film encapsulation layer which are stacked on a base substrate, wherein the thin film encapsulation layer comprises an inorganic layer and an organic layer stacked on each other;
  wherein the organic insulating layer is disposed corresponding to the display region, the inorganic insulating layer and the thin film encapsulation layer are disposed corresponding to the display region, the peripheral region, and the light transmissive region, and a first through hole is defined in the display panel corresponding to the light transmissive region;
  wherein at least one groove is defined in the inorganic insulating layer corresponding to the peripheral region, the organic layer is arranged at one side of the groove near the organic insulating layer, and a portion of the inorganic layer corresponding to the groove is in contact with the inorganic insulating layer at a side wall and a bottom of the groove.

In the display panel of the present application, in the peripheral region, a height difference is formed at the side wall of the groove and between a portion of the inorganic layer outside the groove and a portion of the inorganic layer corresponding to the bottom of the groove.

In the display panel of the present application, the at least one groove comprises a first groove formed in the light transmissive region and the peripheral region, and an orthographic projection of a bottom of the first groove projected on the display panel covers the light transmissive region.

In the display panel of the present application, the at least one groove further comprises a plurality of annular grooves formed in the peripheral region, and the annular grooves are located outside the first groove.

In the display panel of the present application, at least two annular grooves are arranged at intervals from a position close to the light transmissive region to a position away from the light transmissive region.

In the display panel of the present application, the inorganic insulating layer comprises a buffer layer, a gate insulating layer, and an interlayer insulating layer which are sequentially stacked, the organic insulating layer comprises a planarizing layer, a pixel definition layer, and a spacer layer which are stacked, and the at least one groove partially or entirely penetrates the inorganic insulating layer.

In the display panel of the present application, a rounded corner is formed between the side wall and the bottom of the groove, or an angle greater than or equal to 90° is formed between the side wall and the bottom of the groove.

In the display panel of the present application, the side wall of the groove is a flat surface, an arc surface, or a stepped structure.

The present application provides a display panel, comprising:
  a display region, a light transmissive region, and a peripheral region, wherein the peripheral region surrounds the light transmissive region, and the display region surrounds the peripheral region;
  an inorganic insulating layer, an organic insulating layer, and a thin film encapsulation layer which are stacked on a base substrate, wherein the thin film encapsulation layer comprises an inorganic layer and an organic layer stacked on each other;
  wherein the organic insulating layer is disposed corresponding to the display region, the inorganic insulating layer and the thin film encapsulation layer are disposed corresponding to the display region, the peripheral region, and the light transmissive region, and a first through hole is defined in the display panel corresponding to the light transmissive region;
  wherein at least one groove is defined in the inorganic insulating layer corresponding to the peripheral region, the organic layer is arranged at one side of the groove near the organic insulating layer, a portion of the inorganic layer corresponding to the groove is in contact with the inorganic insulating layer at a side wall and a bottom of the groove, and a boundary line of the groove is one or a combination of a straight line, an arc line, and a polyline.

In the display panel of the present application, in the peripheral region, a height difference is formed at the side wall of the groove and between a portion of the inorganic layer outside the groove and a portion of the inorganic layer corresponding to the bottom of the groove.

In the display panel of the present application, the at least one groove comprises a first groove arranged corresponding to the light transmissive region and the peripheral region, and an orthographic projection of the bottom of the first groove projected on the display panel covers the light transmissive region.

In the display panel of the present application, the at least one groove further comprises a plurality of annular grooves formed in the peripheral region, and the annular grooves are located outside the first groove.

In the display panel of the present application, at least two annular grooves are arranged at intervals from a position close to the light transmissive region to a position away from the light transmissive region.

In the display panel of the present application, the inorganic insulating layer comprises a buffer layer, a gate insulating layer, and an interlayer insulating layer which are sequentially stacked, the organic insulating layer comprises a planarizing layer, a pixel definition layer, and a spacer layer which are stacked, and the at least one groove partially or entirely penetrates the inorganic insulating layer.

In the display panel of the present application, a rounded corner is formed between the side wall and the bottom of the groove, or an angle greater than or equal to 90° is formed between the side wall and the bottom of the groove.

In the display panel of the present application, the side wall of the groove is a flat surface, an arc surface, or a stepped structure.

The present application provides a display device, comprising the display panel of claim 1 and a camera assembly, wherein the display panel comprises the display region, the light transmissive region, and the peripheral region, the peripheral region surrounds the light transmissive region, and the display region surrounds the peripheral region;

wherein a first through hole is defined in a portion of the display panel corresponding to the light transmissive region;

wherein the camera assembly is arranged on a back portion of the display panel and disposed corresponding to the first through hole, and the camera assembly is configured to photograph an object at one side of the display panel away from the camera assembly.

Advantages of the present application:

The present application provides the display panel and the display device. By forming the groove in the peripheral region outside the light transmissive region, the inorganic layer has the height difference at the groove in the peripheral region. That is, a portion of the inorganic layer forms a slope. Because the density of the inorganic insulating layer is greater than the density of the inorganic layer, the inorganic insulating layer located at the slope of the groove can stop cracks from extending inwardly during cutting, and the groove can stop cracks from extending inwardly during cutting. In addition, by providing multiple annular grooves in the peripheral region, cracks can be further prevented from extending inwardly.

BRIEF DESCRIPTION OF THE SEVERAL VIEWS OF THE DRAWINGS

Hereinafter, a description in conjunction with the accompanying figures is provided to more clearly illustrate the embodiments of the present disclosure, which will ease the understanding of the technical solutions and other beneficial effects of the present application.

DESCRIPTION OF SPECIFIC EMBODIMENTS OF THE INVENTION

Figure 1:
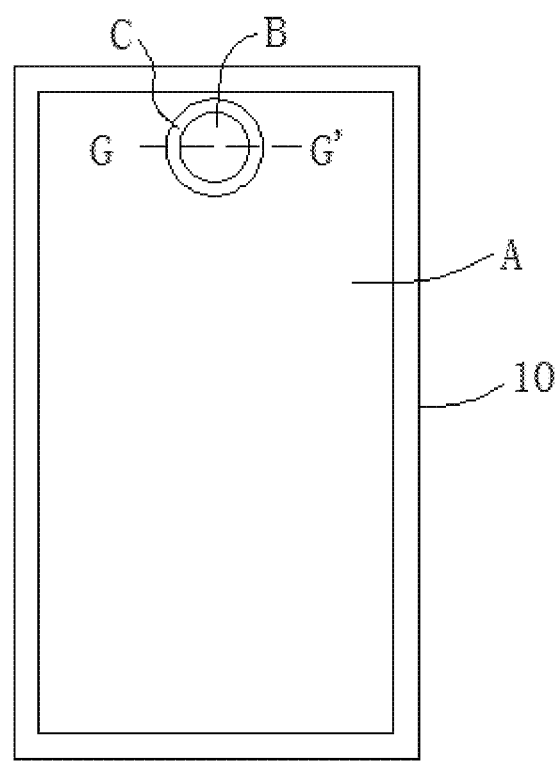
FIG. 1 is a schematic structural view illustrating a display panel according to one embodiment of the present application.

The following descriptions are provided with reference to the accompanying drawings to illustrate specific embodiments of the present application. The directional terms mentioned in the present application, such as "upper", "lower", "front", "rear", "left", "right", "inside", "outside", and "lateral", are merely illustrative based on the accompanying drawings. Therefore, the directional terms are provided for ease of understanding the present application, are not used to limit the present application. In the figures, structurally similar elements are denoted by the same reference numerals.

The present application is directed to solving a technical problem of a conventional organic light-emitting diode (OLED) display panel with an under-screen camera. The problem is that cracks are generated and extended inwardly when a through hole is cut out in a light-transmissive region. The present application can solve this defect.

Please refer to FIG. 1 illustrating a display panel according to one embodiment of the present application. For a higher screen ratio, the display panel 10 in the present application is an organic light-emitting diode (OLED) display panel with an under-screen camera. The OLED display panel comprises a display region A, a light transmissive region B, and a peripheral region C. The peripheral region C surrounds the light transmissive region B, and the display region A surrounds the peripheral region C. A portion of the display panel 10 corresponding to the light transmissive region B is cut to form a first through hole exposing the under-screen camera.

Figure 2:
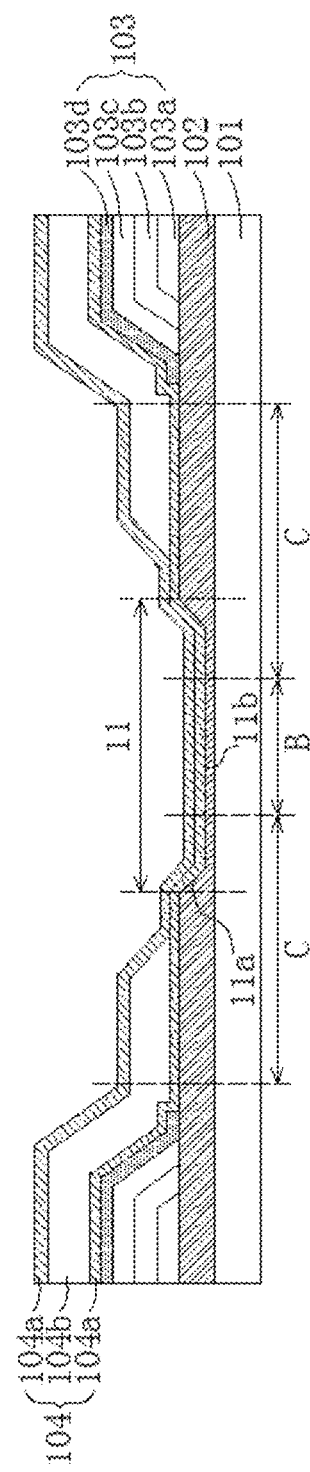
FIG. 2 is a cross-sectional view taken along section line G-G' in FIG. 1.

FIG. 2 is a cross-sectional view taken along section line G-G' in FIG. 1. The display panel 10 comprises a base substrate 101, a multi-layered inorganic insulating layer 102 disposed on the base substrate 101, a multi-layered organic insulating layer 103 disposed on the inorganic insulating layers 102, a multi-layered metal layer (not illustrated) disposed between the inorganic insulating layer 102 and the organic insulating layer 103, a semiconductor layer (not illustrated) disposed in the multi-layered inorganic insulating layer 102, a pixel electrode layer (not illustrated) disposed in the multi-layered organic insulating layer 103, and a thin film encapsulation layer 104 disposed on the organic insulating layers 103. The multi-layered inorganic insulating layer 102 comprises, but is not limited to, a buffer layer, a gate insulating layer, and an interlayer insulating layer. The organic insulating layer 103 comprises, but is not limited to, a planarizing layer 103a, a pixel definition layer 103b, and a spacer layer 103c, and an organic light-emitting layer 103d.

The first through hole entirely or partially penetrates one or more of the base substrate 101, the inorganic insulating layer 102, the organic insulating layer 103, and the thin film encapsulation layer 104.

The thin film encapsulation layer 104 is in direct contact with the inorganic insulating layer 102 in the light transmissive region B and the peripheral region C surrounding the light transmissive region B. The thin film encapsulation layer 104 comprises at least three layers which include an inorganic layer 104a, an organic layer 104b, and the inorganic layer 104a stacked on each other. A groove is defined in the inorganic insulating layer 102 in the peripheral region C, and the inorganic layer 104a forms a continuous thin film along the groove in the peripheral region C and the light transmissive region B.

Specifically, as shown in FIG. 2, the display panel 10 is provided with a first groove 11 formed in the peripheral region C and the light transmissive region B, and the first groove 11 is formed in the inorganic insulating layer 102, and the first groove 11 partially penetrates or entirely penetrates the inorganic insulating layer 102.

The organic layer 104b is located outside the first groove 11. That is, the organic layer 104b is disconnected outside the first groove 11. The inorganic layer 104a forms a continuous thin film in the light transmissive region B and the peripheral region C. A portion of the inorganic layer 104a corresponding to the first groove 11 is in close contact with the inorganic insulating layer 102 at a side wall 11a and a bottom 11b of the first groove 11. An orthographic projection of the bottom 11b of the first groove 11 projected on the base substrate 101 covers the light transmissive region B. In the peripheral region C, a height difference is formed at the side wall 11a of the first groove 11 and between a portion of the inorganic layer 104a outside the first groove 11 and a portion of the inorganic layer 104a corresponding to the bottom 11b of the groove 11. That is to say, in the peripheral region C, the inorganic layer 104a forms a climbing slope at the side wall 11a of the first groove 11 from one side close to the light transmissive region B toward one side away from the light transmissive region B. Moreover, process temperatures of the inorganic insulating layer 102 are about 370°, and the inorganic layer 104a is produced in a low-temperature process with process temperatures about 100°, so density of the inorganic insulating layer 102 is greater than density of the inorganic layer 104a. Therefore, in cutting of a portion of the display panel corresponding to the light transmissive region B, cracks generated at cutting positions of the inorganic layer 104a stop at the slope, so the first groove 11 can stop the cracks from extending inwardly.

In the present embodiment, the first groove 11 is a circular groove, and the light transmissive region B is also of a circular shape. A diameter of the circular groove is 10 um to 100 um larger than a diameter of the light transmissive region B. In alternative embodiments, the light transmissive region B can have other shapes such as a rectangular shape or a U shape. Also, the shape of the first groove 11 is not limited to the above-mentioned shape, and the shape of the first groove 11 can be, for example, rectangular or polygonal, as long as the inorganic layer 104a can form a slope (a height difference) in the peripheral region C around the light transmissive region B.

According to one embodiment of the present invention, a boundary line of the first groove 11 is one or a combination of a straight line, an arc line, and a polyline.

In the present embodiment, an included angle between the side wall 11a and the bottom 11b of the first groove 11 is greater than or equal to 90°, so that the inorganic layer 104a can cover an entire surface of the first groove 11. Therefore, continuous film formation of the inorganic layer 104a can be ensured. In alternative embodiment, a rounded corner is formed between the sidewall 11a and the bottom 11b of the first groove 11, so that the inorganic layer 104a forms a continuous film at the corner between the sidewall 11a and the bottom 11b of the first groove 11. Accordingly, the encapsulation effect of the thin film encapsulation layer 104 is ensured.

In the present embodiment, the side wall 11a of the first groove 11 can be a flat surface, an arc surface, or a stepped structure. If the side wall 11a is designed as a stepped structure, cracks have more paths to extend through from the bottom 11b to the outside of the first groove 11, so that the cracks can be prevented from extending further inwardly in the display panel.

In another embodiment, a cross-sectional shape of the bottom 11b of the first groove 11 can also be a stepped structure, especially for a portion of the bottom 11b located in the peripheral region C. By using the stepped-structure design, cracks generated at a boundary of the light transmissive region B have more paths to extend through, thus preventing the cracks from extending further inwardly in the display panel.

Figure 3:
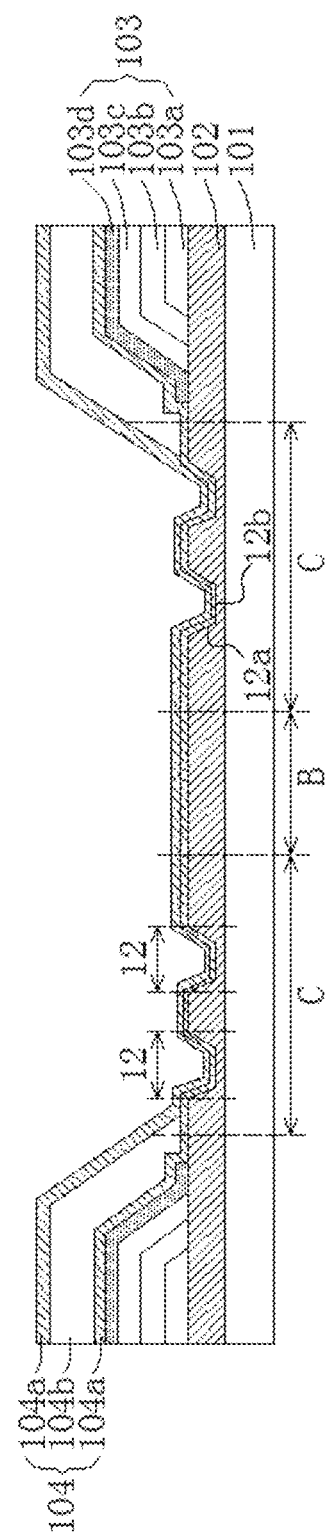
FIG. 3 is another cross-sectional view taken along the section line G-G' in FIG. 1.

As shown in FIG. 3, it is another cross-sectional view taken along the section line G-G' in FIG. 1. FIG. 3 is different from FIG. 2 in that the display panel 10 of FIG. 3 does not need to be provided with the first groove 11, but instead forms at least one annular groove 12 in the peripheral region C. A diameter of the annular groove 12 is larger than a diameter of the light transmissive region B. The annular groove 12 is formed in the inorganic insulating layer 102, and the annular groove 12 partially or entirely penetrates the inorganic insulating layer 102. In the present embodiment, at least two annular grooves 12 are arranged at intervals from a position near the light transmissive region B to a position away from the light transmissive region B. In other words, multiple annular grooves 12 are formed in the peripheral region C.

The organic layer 104 b is located outside the annular groove 12, the inorganic layer 104 a forms a continuous film in the light transmissive region B and the peripheral region C, and a portion of the inorganic layer 104a corresponding to the annular groove 12 is in close contact with the inorganic insulating layer 102 at the side wall 12a and the bottom 12b of the annular groove 12. In the peripheral region C, a height difference is formed at the side wall 12a of the annular groove 12 and between a portion of the inorganic layer 104a outside the annular groove 12 and a portion of the inorganic layer 104a corresponding to the bottom 12b of the annular groove 12. In other words, the inorganic layer 104a forms multiple slopes in the peripheral region C. Therefore, in cutting a portion of the display panel corresponding to the light transmissive region B, cracks generated at cutting positions of the inorganic layer 104a stop at the slopes, so the annular groove 12 can stop the cracks from extending further inwardly.

The at least two annular grooves 12 can have the same or different depths. In one embodiment, the depths of the annular grooves 12 gradually increase from one side near the light transmissive region B to one side away from the light transmissive region B, and thereby the annular grooves 12 can better avoid crack extension.

The side wall 12a and the bottom 12b of the annular groove 12 can have similar structures as those of the first groove 11, so please refer to the above description of the first groove 11 for details about these structures.

Figure 4:
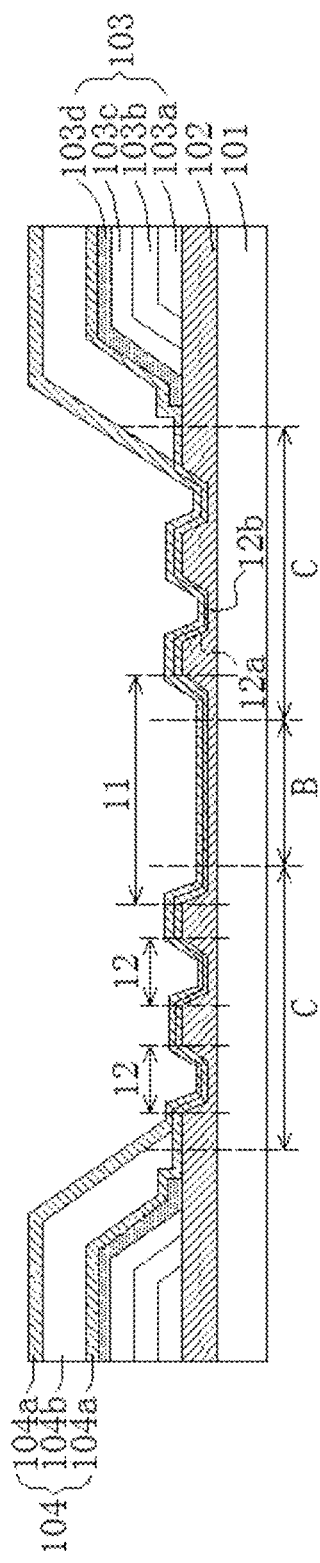
FIG. 4 is still another cross-sectional view taken along the section line G-G' in FIG. 1.
Figure 5:
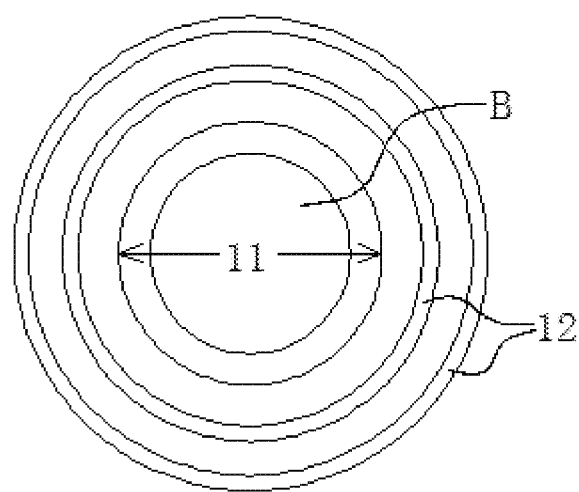
FIG. 5 is a top view of a peripheral region and a light transmissive region in FIG. 4.

Please refer to FIG. 4, which is still another cross-sectional view taken along the section line G-G' in FIG. 1. Please also refer to FIG. 5 together, which is a top view of the peripheral region and the light transmissive region in FIG. 4. FIG. 4 is different from FIG. 2 and FIG. 3 in that, the display panel 10 in FIG. 4 comprises both the first groove 11 and the annular groove 12, and the annular groove 12 is located outside the first groove 11. For more details about the structures of the first groove 11 and the annular groove 12, please refer to the description in the above embodiments, and a detailed description thereof is omitted herein. Since the annular groove 12 is additionally arranged outside the first groove 11, cracks can be prevented from extending inward to the maximum extent.

Figure 6:
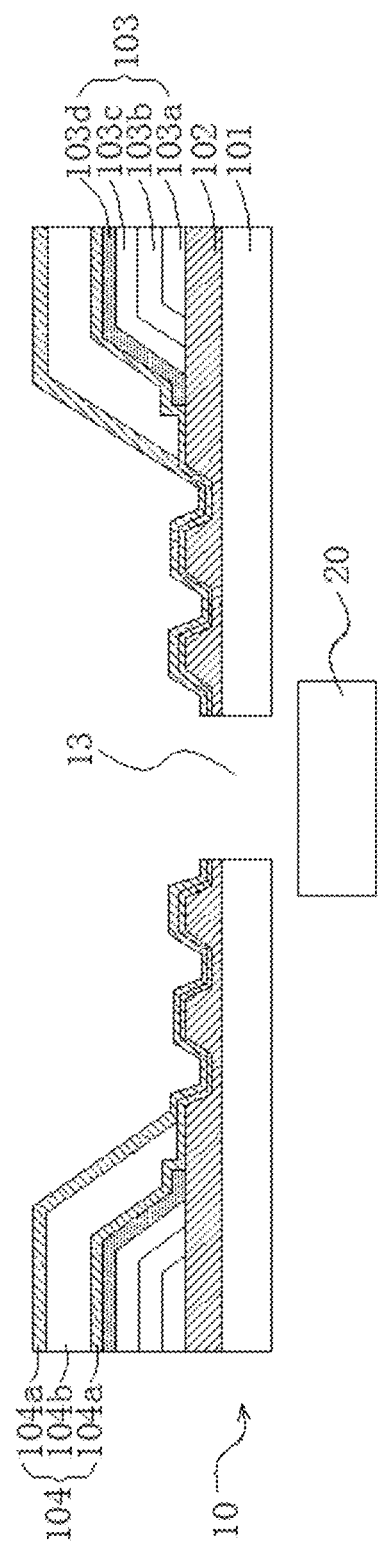
FIG. 6 is a schematic cross-sectional view illustrating a display device according to one embodiment of the present application.

The present application also provides a display device. As shown in FIGS. 1 and 6, the display device comprises the display panel 10 and a camera assembly 20 as described above. The display panel 10 comprises the display region A, the light transmissive region B, and the peripheral region C. The peripheral region C surrounds the light transmissive region B, and the display region A surrounds the peripheral region C. By cutting, a first through hole 13 is formed penetrating through upper and lower surfaces of a portion of the display panel 10 corresponding to the light transmissive region B. The camera assembly 20 is arranged on a back portion of the display panel 10 corresponding to the first through hole 13, and the camera assembly 20 is used to photograph an object at one side of the display panel 10 away from the camera assembly 20.

For more details about the structure of the display panel 10, please refer to the description in the above embodiment, and a detailed description thereof is repeated herein for brevity.

In summary, although the present application has been disclosed above with preferable embodiments, the above preferable embodiments are not intended to limit the present application. Those skilled in the art can make various modifications without departing from the spirit and scope of the present application. Therefore, the protection scope of the present application should be defined by the appended claims.

What is claimed is:

1. A display panel, having a display region, a light transmissive region, and a peripheral region, wherein the peripheral region surrounds the light transmissive region, and the display region surrounds the peripheral region,
   the display panel comprising an inorganic insulating layer, an organic insulating layer, and a thin film encapsulation layer which are stacked on a base substrate,
   wherein the thin film encapsulation layer comprises an inorganic layer and an organic layer stacked on each other;
   wherein the organic insulating layer is disposed corresponding to the display region, the inorganic insulating layer and the thin film encapsulation layer are disposed corresponding to the display region, the peripheral region, and the light transmissive region, and a first through hole is defined in the display panel corresponding to the light transmissive region;
   wherein a plurality of annular grooves are formed in the inorganic insulating layer and arranged at intervals in the peripheral region, and respective depths of the annular grooves gradually increase from a side of the peripheral region close to the light transmissive region to a side of the peripheral region away from the light transmissive region, the organic layer surrounds the annular grooves, and a portion of the inorganic layer corresponding to each of the annular grooves is in contact with the inorganic insulating layer at a side wall and a bottom of the each of the annular grooves.

2. The display panel according to claim 1, wherein in the peripheral region, a height difference between a portion of the inorganic layer outside the each of the annular grooves and a portion of the inorganic layer at the bottom of the each of the annular grooves is formed.

3. The display panel according to claim 2, wherein a first groove is further formed in the inorganic insulating layer and defined in the light transmissive region and the peripheral region, the annular grooves are located outside the first groove, and an orthographic projection of a bottom of the first groove on the display panel covers the light transmissive region.

4. The display panel according to claim 1, wherein the inorganic insulating layer comprises a buffer layer, a gate insulating layer, and an interlayer insulating layer which are sequentially stacked, the organic insulating layer comprises a planarizing layer, a pixel definition layer, and a spacer layer which are stacked, and the each of the annular grooves partially or entirely penetrates the inorganic insulating layer.

5. The display panel according to claim 1, wherein a rounded corner is formed between the side wall and the bottom of the each of the annular grooves, or an angle greater than or equal to 90° is formed between the side wall and the bottom of the each of the annular grooves.

6. The display panel according to claim 1, wherein the side wall of the each of the annular grooves is a flat surface, an arc surface, or a stepped structure.

7. A display device, comprising the display panel of claim 1 and a camera assembly, wherein the display panel comprises the display region, the light transmissive region, and the peripheral region, the peripheral region surrounds the light transmissive region, and the display region surrounds the peripheral region;
   wherein a first through hole is defined in a portion of the display panel corresponding to the light transmissive region;
   wherein the camera assembly is arranged on a back portion of the display panel and disposed corresponding to the first through hole, and the camera assembly is configured to photograph an object at one side of the display panel away from the camera assembly.

8. A display panel, comprising:
   a display region, a light transmissive region, and a peripheral region, wherein the peripheral region surrounds the light transmissive region, and the display region surrounds the peripheral region;
   an inorganic insulating layer, an organic insulating layer, and a thin film encapsulation layer which are stacked on a base substrate, wherein the thin film encapsulation layer comprises an inorganic layer and an organic layer stacked on each other;
   wherein the organic insulating layer is disposed corresponding to the display region, the inorganic insulating layer and the thin film encapsulation layer are disposed corresponding to the display region, the peripheral region, and the light transmissive region, and a first through hole is defined in the display panel corresponding to the light transmissive region;

wherein a plurality of annular grooves are formed in the inorganic insulating layer and arranged at intervals in the peripheral region, and respective depths of the annular grooves gradually increase from a side of the peripheral region close to the light transmissive region to a side of the peripheral region away from the light transmissive region, the organic layer surrounds the annular grooves, a portion of the inorganic layer corresponding to each of the annular grooves is in contact with the inorganic insulating layer at a side wall and a bottom of the each of the annular grooves, and a boundary line of the each of the annular grooves is one or a combination of a straight line, an arc line, and a polyline.

9. The display panel according to claim 8, wherein in the peripheral region, a height difference between a portion of the inorganic layer outside the each of the annular grooves and a portion of the inorganic layer at the bottom of the each of the annular grooves is formed.

10. The display panel according to claim 9, wherein a first groove is further formed in the inorganic insulating layer and defined in the light transmissive region and the peripheral region, the annular grooves are located outside the first groove, and an orthographic projection of a bottom of the first groove on the display panel covers the light transmissive region.

11. The display panel according to claim 8, wherein the inorganic insulating layer comprises a buffer layer, a gate insulating layer, and an interlayer insulating layer which are sequentially stacked, the organic insulating layer comprises a planarizing layer, a pixel definition layer, and a spacer layer which are stacked, and the each of the annular grooves partially or entirely penetrates the inorganic insulating layer.

12. The display panel according to claim 8, wherein a rounded corner is formed between the side wall and the bottom of the each of the annular grooves, or an angle greater than or equal to 90° is formed between the side wall and the bottom of the each of the annular grooves.

13. The display panel according to claim 8, wherein the side wall of the each of the annular grooves is a flat surface, an arc surface, or a stepped structure.

* * * * *